United States Patent
do Nascimento

(10) Patent No.: US 7,038,500 B2
(45) Date of Patent: May 2, 2006

(54) CIRCUIT ARRANGEMENT FOR CONTROLLING POWER SEMICONDUCTOR TRANSISTORS

(75) Inventor: Jair do Nascimento, Dormitz (DE)

(73) Assignee: Semikron Elektronik GmbH & Co. KG, Nuremberg (DE)

( * ) Notice: Subject to any disclaimer, the term of this patent is extended or adjusted under 35 U.S.C. 154(b) by 24 days.

(21) Appl. No.: 10/638,664

(22) Filed: Aug. 11, 2003

(65) Prior Publication Data

US 2005/0024103 A1 Feb. 3, 2005

(30) Foreign Application Priority Data

Aug. 9, 2002 (DE) .................. 102 36 532

(51) Int. Cl.
*H03B 1/00* (2006.01)
(52) U.S. Cl. ...................... 327/108; 327/427
(58) Field of Classification Search ............... 327/108, 327/109, 110, 111, 112, 427, 530, 538, 309, 327/312, 313, 314, 315, 316, 323, 324, 327, 327/328
See application file for complete search history.

(56) References Cited

U.S. PATENT DOCUMENTS

| | | | |
|---|---|---|---|
| 5,977,814 A * | 11/1999 | Ishii | 327/434 |
| 6,222,403 B1 * | 4/2001 | Mitsuda | 327/170 |
| 6,222,414 B1 * | 4/2001 | Cini et al. | 327/432 |
| 6,271,708 B1 * | 8/2001 | Hoshi et al. | 327/377 |
| 6,545,513 B1 * | 4/2003 | Tsuchida et al. | 327/108 |
| 6,556,407 B1 * | 4/2003 | Elliott et al. | 361/100 |

FOREIGN PATENT DOCUMENTS

| | | |
|---|---|---|
| DE | 19855604 C1 | 12/1998 |
| EP | 0620646 A1 | 10/1994 |
| JP | 07321621 | 12/1995 |

* cited by examiner

*Primary Examiner*—Jeffrey Zweizig
(74) *Attorney, Agent, or Firm*—Lackenbach Siegel, LLP; Andrew F. Young, Esq.

(57) ABSTRACT

A current regulated circuit arrangement for controlling a power semiconductor transistor, as example a MOSFET or IGBT power transistor, that includes at least two mirror-symmetrically arranged regulated power sources and an output voltage regulator. A first regulated power source is fed from an unregulated power source and controls the gate of the power transistor such that the power transistor is switched into the conductive state. A second regulated power source is fed from an unregulated power source and controls the gate of the power transistor such that the power transistor is switched into the non-conductive state. A voltage regulator or limiter limits the current at the gate of the power transistor to a operably suitable maximum value.

25 Claims, 3 Drawing Sheets

CIRCUIT ARRANGEMENT FOR CONTROLLING POWER SEMICONDUCTOR TRANSISTORS

PRIORITY CLAIM AND INCORPORATION BY REFERENCE

This application claims priority from DE 102 36 532.6, filed Aug. 9, 2002, the contents of which are incorporated herein by reference.

SELECTED FIGURE FOR PUBLICATION

FIG. 2.

BACKGROUND OF THE INVENTION

1. Field of the Invention

The present invention relates to a circuit arrangement for controlling power semiconductor transistors, often used in power switches and circuit breaker type devices. More specifically, the present invention relates to a circuit arrangement for controlling a power semiconductor transistor through the use of at least two mirror-symmetrical power sources resulting in a faster commutation with a linear current voltage response.

2. Description of the Related Art

Power transistors such as IGBTs (Insulating-Gate Bipolar Transistors) or MOSFETs (Metal Oxide Semiconductor Field-Effect Transistors) are conventionally known. In use, power transistors such as IGBTs are regulated, i.e. switched into a conductive or non-conductive state, by applying a certain voltage between the gate and the emitter.

To switch the transistor into a conductive state, i.e. allowing power flow between the collector and the emitter, the gate is charged with the applied voltage.

To switch the transistor into the non-conductive state, the gate is reversed, i.e. charged with the other polarity. This happens, for example, in IGBTs when a voltage of opposite polarity is applied between the gate and the emitter.

These switching processes, from a conductive to non-conductive stage or vice versa are also called commutation.

It should be understood, that in the following description, the same relationships as described for an IGBT also apply to the corresponding connections—drain and source—of a MOSFET component, although a MOSFET is usually switched into the non-conductive state by applying a zero voltage.

Power transistors can be controlled according to different control principles. These different control principals include gate control via resistor control circuits, via voltage control circuits and via current control circuits. The most common of these is the resistor control circuit. Characteristic for such a control circuit is the formation of a so-called Miller plateau in the time path or time progression curve of the voltage between gate and emitter during a commutation process. The supply of the gate in the time path after the passage of the Miller plateau generally shows the path of a curve with a non-linear (1-exp(-t)) dependence.

Referring now to FIG. 1, a simulation of the time path of a gate-emitter voltage $V_{GE}$ and of a charging current $I_O$ of the gate with resistor control according to the conventional art is shown during a commutation process. At a beginning of the commutation process, at approximately 0.5 µs, the charging current $I_O$ increases sharply while the voltage $V_{GE}$ rises almost linearly along $V_{11}$. After about 0.5 µs, the Miller plateau $V_{12}$ is reached, whose time expansion or duration is about 0.7 µs. During this time, the charging current $I_G$ is also constant. During the further progression along $V_{13}$, the gate-emitter voltage $V_{GE}$ increases until it reaches the expected value with a non-linear slope (1-exp(-t)) characteristic, as earlier noted. In total, the expected value of 15 V is reached after about 6 µs. During that time, the charging current $I_G$ also drops in a corresponding and characteristic fashion.

As can be easily seen from FIG. 1, one disadvantage of controlling gate control circuits via resistor control or voltage control circuits is the necessity of a stabilized supply voltage source. This is an inevitable requirement to keep the power losses of the power transistor (which requires a defined gate voltage) low.

Another disadvantage of the time path of the non-linear charge curve of the gate (after the Miller plateau) is that the curved response necessarily delays the switching process of the power transistor. The power transistor does not switch at the rate to which it would be technically able. This delay in switching time results in disadvantageous switching power losses.

Another unfortunate consequence of the above-mentioned curved time response path is that a collector-emitter voltage, which in the conventional art is not active during the switching process itself, can only be activated with a delay necessitated and caused by the curved response time path failing to timely meet its required value.

OBJECTS AND SUMMARY OF THE INVENTION

An object of the present invention is to provide a circuit arrangement for controlling power semiconductor transistors that overcomes the disadvantages and concerns noted above.

It is another objective of the present invention to introduce a circuit arrangement, for the control of power semiconductor transistors that has a low or minimal technical complexity, provides an even and quick charge, discharge and recharge of the power transistor's gate, and consequently keeps power losses very low during commutation, thus allowing "soft" commutation.

The present invention relates to a current regulated circuit arrangement for controlling a power semiconductor transistor, for example a MOSFET or IGBT power transistor, that includes at least two mirror-symmetrically arranged regulated power sources and an output voltage regulator. A first regulated power source is fed from an unregulated power source and controls the gate of the power transistor such that the power transistor is switched into the conductive state. A second regulated power source is fed from an unregulated power source and controls the gate of the power transistor such that the power transistor is switched into the non-conductive state. A voltage regulator or limiter limits the current at the gate of the power transistor to a operably suitable maximum value.

According to an embodiment of the present invention there is provided a current regulated circuit arrangement, for controlling at least one power semiconductor transistor, comprising: at least a first and a second regulated power sources and an output voltage regulator, the at least first and second power sources having respective first and second circuits each being substantially mirror-symmetrical to each other, the first regulated power source being fed from a first unregulated power source and controlling a gate of the power transistor such that the power transistor is conductive, the second regulated power source being fed from a second unregulated power source and controlling the gate of the power transistor such that the power transistor is non-conductive, and the output voltage regulator limiting a voltage at the gate of the power transistor to a maximum value during a use, whereby the voltage at the gate is limited to the maximum value.

According to another embodiment of the present invention there is provided a current regulated circuit arrangement, further comprising: an input circuit for limiting an input voltage to the circuit arrangement, and the input circuit being upstream of the circuit arrangement.

According to another embodiment of the present invention there is provided a current regulated circuit arrangement, wherein: the output voltage regulator controllably acts directly upon inputs of each the first and second regulated power sources, whereby the output voltage regulator limits the voltage supplied by the first and second power sources to the gate of the power transistor.

According to another embodiment of the present invention there is provided a current regulated circuit arrangement, wherein: the first regulated power source further comprises: a circuit containing at least a first and second transistors, and the first and second transistors being at least one of a npn- and a n-channel type transistors.

According to another embodiment of the present invention there is provided a current regulated circuit arrangement, wherein: the second regulated power source further comprises: a circuit containing at least a third and a fourth transistor, and the third and fourth transistors being at least one of pnp- and a p-channel transistors.

According to another embodiment of the present invention there is provided a current regulated circuit arrangement, wherein: the at least one power transistor is a MOSFET and the second unregulated power source has zero voltage.

According to another embodiment of the present invention there is provided a current regulated circuit arrangement, wherein: the at least one power transistor is an IGBT.

According to another embodiment of the present invention there is provided a current regulated circuit arrangement, comprising: at least a first and a second regulated power sources and an output voltage regulator, the at least first and second power sources having respective first and second circuit designs being substantially mirror-symmetrical to each other, the first regulated power source being fed from a first unregulated power source and controlling a gate of the power transistor such that the power transistor is conductive, the second regulated power source being fed from a second unregulated power source and controlling the gate of the power transistor such that the power transistor is non-conductive, the output voltage regulator limiting a voltage at the gate of the power transistor to a maximum value during a use, whereby the voltage at the gate is limited to the maximum value an input circuit for limiting an input voltage to the circuit arrangement, the input circuit being upstream of the circuit arrangement, and the output voltage regulator controllably acts directly upon the inputs of each the first and second regulated power sources, whereby the output voltage regulator limits the voltage supplied by the first and second power sources to the gate of the power transistor.

According to another embodiment of the present invention there is provided a current regulated circuit arrangement, wherein: the first regulated power source further comprises: a circuit containing at least a first and second transistors, and the first and second transistors being at least one of a npn- and a n-channel type transistors.

According to another embodiment of the present invention there is provided a current regulated circuit arrangement, wherein: the second regulated power source further comprises: a circuit containing at least a third and a fourth transistor, and the third and fourth transistors being at least one of pnp- and p-channel transistors.

According to another embodiment of the present invention there is provided a current regulated circuit arrangement, wherein: the at least one power transistor is a MOSFET and the second unregulated power source has zero voltage.

According to another embodiment of the present invention there is provided a current regulated circuit arrangement, wherein: the at least one power transistor is an IGBT.

According to another embodiment of the present invention, there is provided an electronic device, comprising: a current regulated circuit arrangement for controlling at least one power semiconductor transistor in the electronic device, comprising: at least a first and a second regulated power sources and an output voltage regulator, the at least first and second power sources having respective first and second circuits each being substantially mirror-symmetrical to each other, the first regulated power source being fed from a first unregulated power source and controlling a gate of the power transistor such that the power transistor is conductive, the second regulated power source being fed from a second unregulated power source and controlling the gate of the power transistor such that the power transistor is non-conductive, the output voltage regulator limiting a voltage at the gate of the power transistor to a maximum value during a use, whereby the voltage at the gate is limited to the maximum value, an input circuit for limiting an input voltage to the circuit arrangement, and the input circuit being upstream of the circuit arrangement.

According to another embodiment of the present invention, there is provided an electronic device, wherein: the output voltage regulator controllably acts directly upon inputs of each the first and second regulated power sources, whereby the output voltage regulator limits the voltage supplied by the first and second power sources to the gate of the power transistor.

According to another embodiment of the present invention, there is provided an electronic device, wherein: the first regulated power source further comprises: a circuit containing at least a first and second transistors, and the first and second transistors being at least one of a npn- and a n-channel type transistors.

According to another embodiment of the present invention, there is provided an electronic device, wherein: the second regulated power source further comprises: a circuit containing at least a third and a fourth transistor, and the third and fourth transistors being at least one of pnp- and a p-channel transistors.

According to another embodiment of the present invention, there is provided an electronic device, wherein: the at least one power transistor is a MOSFET and the second unregulated power source has zero voltage.

According to another embodiment of the present invention, there is provided an electronic device, wherein: the at least one power transistor is an IGBT.

According to another embodiment of the present invention, there is provided a current regulated circuit arrangement for controlling at least one power semiconductor transistor comprising: a first and a second mirror-symmetrical regulated power source and an output voltage regulator, the first regulated power source is fed from a first unregulated power source and controls a gate of the power transistor such that the power transistor is conductive, the second regulated power source is fed from a second unregulated power source and controls the gate of the power transistor such that the power transistor is non-conductive, and the output voltage regulator limits the voltage at the gate of the power transistor to a predetermined maximum value.

According to another embodiment of the present invention, there is provided a current regulated circuit arrangement, further comprising: an input circuit limiting an input voltage to the circuit arrangement is provided upstream of the circuit arrangement.

According to another embodiment of the present invention, there is provided a current regulated circuit arrangement, wherein: the output voltage regulator acts directly back upon the inputs of the first and second regulated power sources.

According to another embodiment of the present invention, there is provided a current regulated circuit arrangement, wherein: the first regulated power source is designed as a circuit of two transistors selected from a group consisting of npn- and n-channel transistors.

According to another embodiment of the present invention, there is provided a current regulated circuit arrangement, wherein: the second regulated power source is designed as a circuit of two transistors selected from a group consisting of pnp- and p-channel transistors.

According to another embodiment of the present invention, there is provided a current regulated circuit arrangement, wherein: the power transistor is a MOSFET, and the second unregulated power source has zero voltage.

According to another embodiment of the present invention, there is provided a current regulated circuit arrangement, wherein: the at least one power transistor is an IGBT.

The above, and other objects, features and advantages of the present invention will become apparent from the following description read in conduction with the accompanying drawings, in which like reference numerals designate the same elements.

DETAILED DESCRIPTION OF THE PREFERRED EMBODIMENTS

Figure 1:
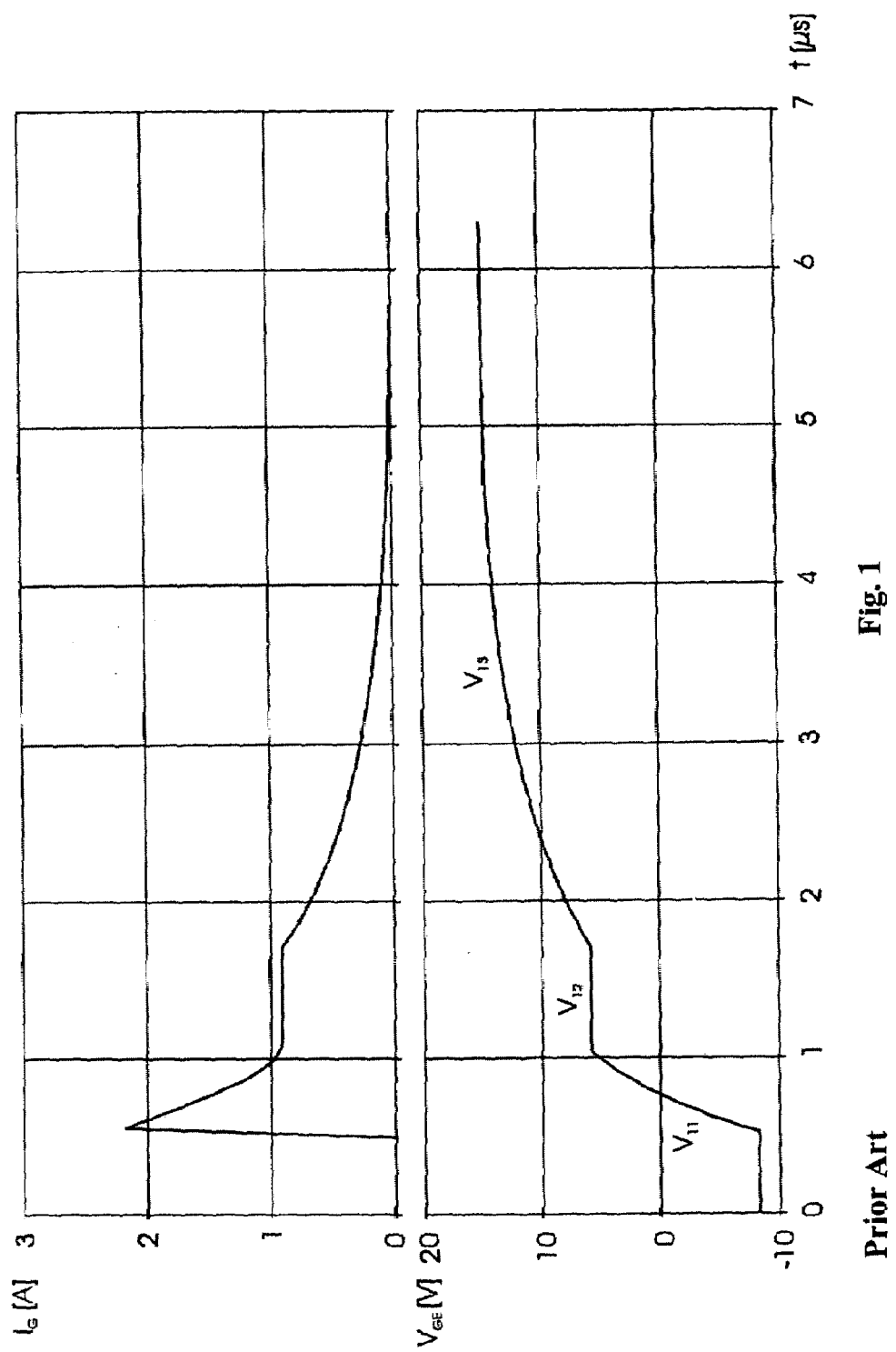
FIG. 1 is a graphical representation of the time path of the gate-emitter voltage with resistor control during a conventional commutation process.

The present invention relates to a circuit arrangement for controlling a power semiconductor transistor, such as a MOSFET or IGBT. These types of power semiconductor transistor devices are often used as power switches in a large variety of technical applications such as the control of electric motors.

In one preferred embodiment of the present invention use, for example only, an -channel IGBT is shown as the power transistor to be controlled, although nothing in the disclosure herein should be understood as limiting the present invention to this particular embodiment. As will be readily recognized by those skilled in the art this type of arrangement applies correspondingly to p-channel IGBTs as well as to any other power transistors to be controlled, such as MOSFETS.

The basic concept of the present invention is based on a current regulated supply of the power transistor's gate, i.e. what is regulated here is the charging current of the gate, and not the charging voltage. For this purpose, the circuit arrangement according to the invention is provided with several circuit components, as will be described.

As used herein, two alternating operating modes must be differentiated—the stationary state and the commutation process. The stationary state shall mean the time during which the charge state of the gate does not change, i.e. while the power transistor remains in either the conductive or in the non-conductive state. The commutation process shall means switching the power transistor from the non-conductive to the conductive state or the opposite, which changes the charge state of the gate. (See Webster's Revised Unabridged Dictionary (1913 Ed.) for support.)

The first part of the inventive circuit arrangement for the control of a gate of a power transistor is an input circuit which limits the input current of the circuit arrangement. The input current has a time-variable binary voltage path. The HIGH or LOW state determines the conductive state of the power transistor. Advantageously, the input circuit is designed such that in the stationary state, a resistor limits the power received by the following circuit components. During the commutation process, a higher current can flow through this input circuit.

The gate of the power transistor is supplied via the outputs of two regulated power sources. The input signal of the two power sources is the output signal of the input circuit. Each of the two power sources is fed from a voltage source. The first power source is supplied with positive polarity from an unregulated voltage source and provides the positive voltage for controlling the gate of the power transistor. The second power source is supplied from an unregulated voltage source of negative polarity and provides the negative voltage for controlling the gate of the power transistor. The internal design of both power sources is substantially mirror-symmetrical, as will be shown and described. One skilled in the art of electrical circuit design, after viewing the Figures and the discussion herein shall understand that mirror-symmetrical shall mean that the circuit designs are substantially symmetrical in reflection to each other, containing similar components arranged in a similar manner. (See Webster's New World Dictionary, $2^{nd}$ College Edition 1970).

The output signal of the two power sources is limited via a voltage regulator to a suitable maximum value for the respective power transistor.

Advantageously, this voltage regulator acts back upon the inputs of the power sources, such that it can prevent flowback from the power sources when the voltage is too high.

It is also advantageous if the circuit arrangement is provided with an additional circuit component which at completely inactive control circuit prevents the charging of the gate and thus an undefined circuit state of the power transistor, as will be described.

It will further be readily understood that through the present circuit arrangement, the resistance value is divided by the current gain factor of the transistor i.e. the effective value is smaller by a factor of at least 100 than that of the conventional art, and the gate is tied with a very low impedance to the emitter via the resistor, as will be described.

The above inventive circuit arrangement has a number of advantages in comparison with the conventional arts, as will be described:

The commutation process requires little time. This reduces power dissipation in the power transistors, and short-circuit monitoring can be activated earlier.

No regulated voltage supplies are necessary. This reduces the capacity necessary in the filter capacitors.

The total technical complexity of the circuit is reduced.

Figure 2:
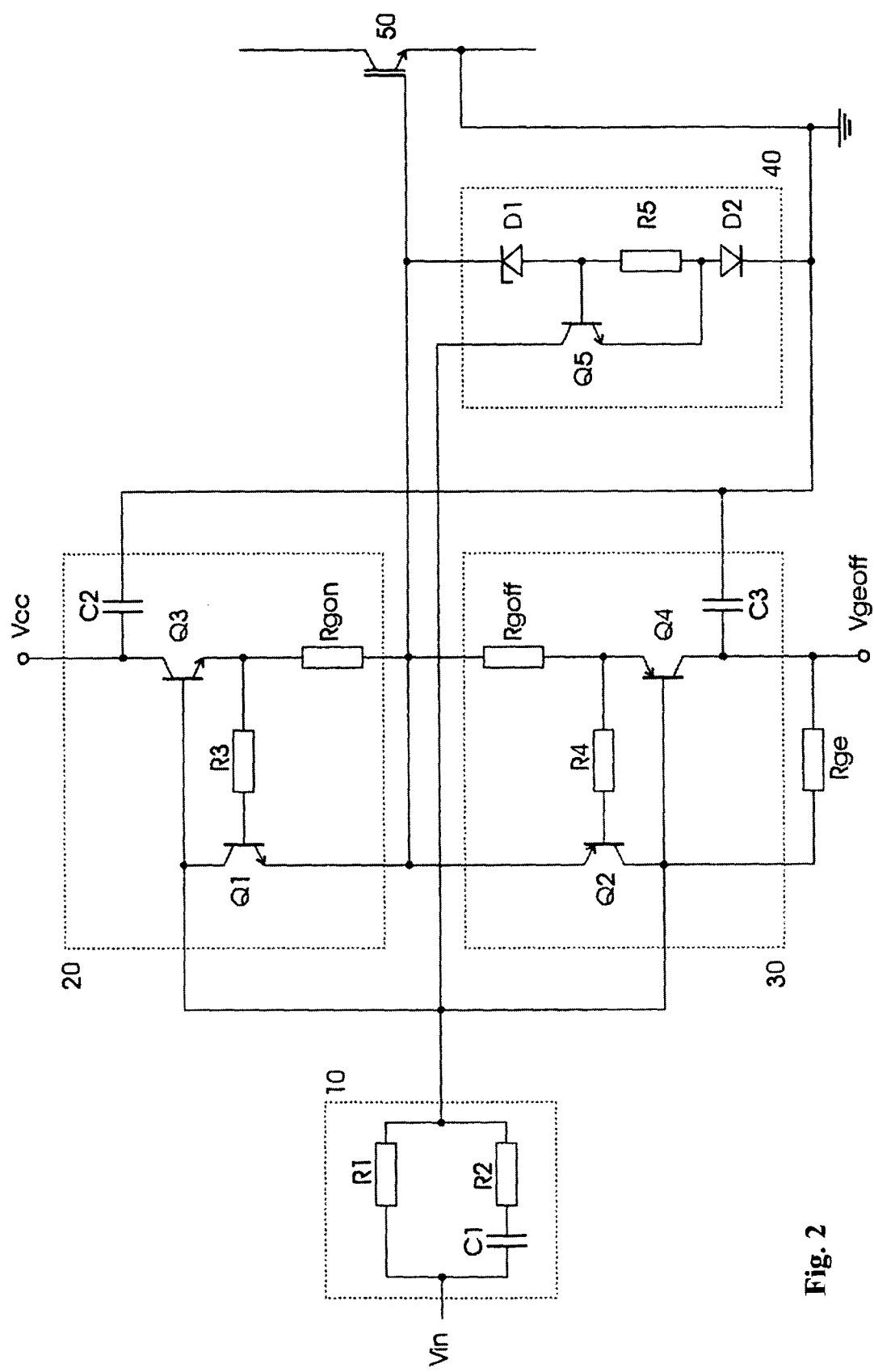
FIG. 2 is a circuit arrangement for controlling power semiconductor transistors according to one embodiment of the present invention.

Referring now to FIG. 2, showing an embodiment of the inventive circuit arrangement for the control of a transistor 50, here shown as an —channel IGBT. It should be understood by those skilled in the art, that as noted above, this type of arrangement applies correspondingly, and with equal preference to p-channel IGBTs as well as to any other power transistors to be controlled, such as MOSFETS. For the dimensioning of the circuit, reference is made to the following Table I:

TABLE I

| R1 | 1.2 kΩ |
|---|---|
| R2 | 100 Ω |
| R3 | 100 Ω |
| R4 | 100 Ω |
| R5 | 100 Ω |
| Rgon | 0.27 Ω |
| Rgoff | 0.56 |
| Rge | 12 kΩ |
| C1 | 22 nF |
| C2 | 2 μF |
| C3 | 4.7 μF |

On the input side, the circuit arrangement is supplied by a time-variable circuit with binary states. The HIGH state (+5V) or the LOW state (−5V) controls the conductive state of the IGBT 50. For that purpose, one input circuit 10, two power sources 20, 30 and one output voltage regulator 40 (or output voltage limiter 40) are provided.

The input circuit 10 consists of a resistor R1 and wired in parallel to it a series circuit of a capacitor C1 and a resistor R2. The signal that prevails after this input circuit is connected with the inputs of the two regulated power sources 20, 30.

The regulated power source 20 consists of a circuit arrangement of two npn transistors Q1, Q3. The power source is supplied from the unregulated supply voltage (VCC), which has a voltage of +18 V . . . +24 V. The capacitor C2 serves as a filter capacitor. The regulated power source 30 is designed mirror-symmetrically with power source 20 (as shown), and here, two pnp transistors Q2, Q4 are used. The power source is supplied from the unregulated supply voltage (Vgeoff), which has a voltage of −8 V. The capacitor C3 serves as a filter capacitor.

The circuit arrangement is also provided with a voltage limiter or regulator 40 consisting of a Zener diode D1, a resistor R5, a diode D2 and a transistor Q5. The collector of the transistor Q5 is connected with the inputs of the power sources 20, 30.

Furthermore, the circuit arrangement is provided with a resistor Rge which, in case of a completely inactive control circuit, prevents the charging of the gate and thus an undefined switching state of the power transistor.

Furthermore, the function of the circuit arrangement and the purpose of the individual circuit components in the various switching states is described.

For the stationary state with the HIGH level as voltage (Vin), the following applies: The input circuit 10—by means of the resistor R1—limits the current that is switched as control current onto the inputs of the power sources 20, 30. Thus, resistor R1 limits the basic flows of the transistors Q3, Q4. Since the transistor Q4 of the power source 30 is a pnp transistor, it is not controlled in that state, and thus the entire power source is inactive.

The input current is also indicated at the base of the npn transistor Q3 and thus limits the maximum current flowing through this transistor to the transistor 50, IGBT 50 in the stationary state. The power source 20 thus supplies the gate of the transistor 50, here IGBT 50, with a positive control voltage and thus keeps the IGBT in the conductive state.

The voltage limiter or regulator 40 operates as the voltage regulator or limiter 40 detects a possible voltage rise of the voltage between gate and emitter of the IGBT 50 above the expected value of +15 V. For that purpose, the series circuit of the Zener diode D1, the resistor R5 and the diode D2 is designed such that a current flows through this branch as soon as a voltage higher than +15 V occurs. Thus, the gate-emitter voltage of the IGBT 50 is regulated or limited to +15 V.

Furthermore, the current flowing in this branch controls the transistor Q5, which reduces the base current in the transistor Q3 of the power source 20 and thus also reduces the current flowing through this transistor to the gate of the IGBT 50. Within the limiter 40, the resistor R5 prevents the transistor Q5 from becoming conductive through a leakage current through the Zener diode D1. The diode D2 ensures that in the switched off state, this branch and thus the voltage limiter 40 is not effective.

The following applies to the stationary state when the current (Vin) is at LOW level: The input circuit 10, with the resistor R1 also limits the current that is switched as the control current onto the inputs of the power sources 20, 30. Since the transistor Q3 of the power source 20 is an npn transistor, it is not controlled in that state, and thus the entire power source 20 is inactive.

The input current is also indicated at the base of the pnp transistor Q4 and thus limits the maximum current that flows through this transistor to the IGBT 50 in the stationary state. The current source 30 thus supplies the gate of the transistor 50, here IGBT 50 with a negative control voltage and thus keeps the transistor, here the IGBT, in a non-conductive state.

In this case, no voltage limiter is active, since an unregulated gate voltage of about −8 V is sufficient to keep the IGBT stable in a non-conductive state.

During the commutation process, the level of the input voltage (Vin) of the circuit arrangement changes from HIGH to LOW or from LOW to HIGH, i.e. the IGBT 50 has to change its switching state as described above. For that purpose, it is practical that a higher current flows through the input circuit, and thus a higher current flows from one of the two power sources 20, 30 to the gate of the IGBT 50. The higher current passing through the input circuit 10 is achieved by means of the parallel-switched branch of the capacitor C1 and the resistor R2, since a current flows though this branch as well during the level change.

During the commutation from LOW to HIGH, the power source 20 produces a positive current to the gate of the IGBT 50; in this case, the resistor (Rgon) functions as a shunt resistor, whereby a part of this current is conducted to the base of the transistor Q1 if the power through the transistor Q3 is too high. The transistor Q1 becomes conductive and thus reduces the base current to the transistor Q3, which causes a reduction of the current through same. The capacitor C2 acts as a filter capacitor for the power source (Vcc). Thus, a regulated power source is created which charges the base of the IGBT 50. The voltage limiter 40 works as described above for the stationary state.

During the commutation from HIGH to LOW, the power source 30 produces a negative current to the gate of the transistor 50, here IGBT 50, in an analogue fashion.

To ensure that the transistor 50, here IGBT 50, is securely in the non-conductive state even in operating states without input voltage (Vin), a resistor is arranged conventionally between the gate and the emitter of the IGBT (50). In comparison, the present inventive arrangement of this resistor Rge between the negative power source (Vgeoff) and the base of the transistor Q4 is advantageous.

It should be readily understood that through this arrangement, the resistance value of Rge is divided by the current gain factor of the transistor Q4, i.e. the effective value is smaller by a factor of at least 100 than that of the conventional art, and the gate is tied with a very low impedance to the emitter via the resistor (Rgeoff).

Figure 3:
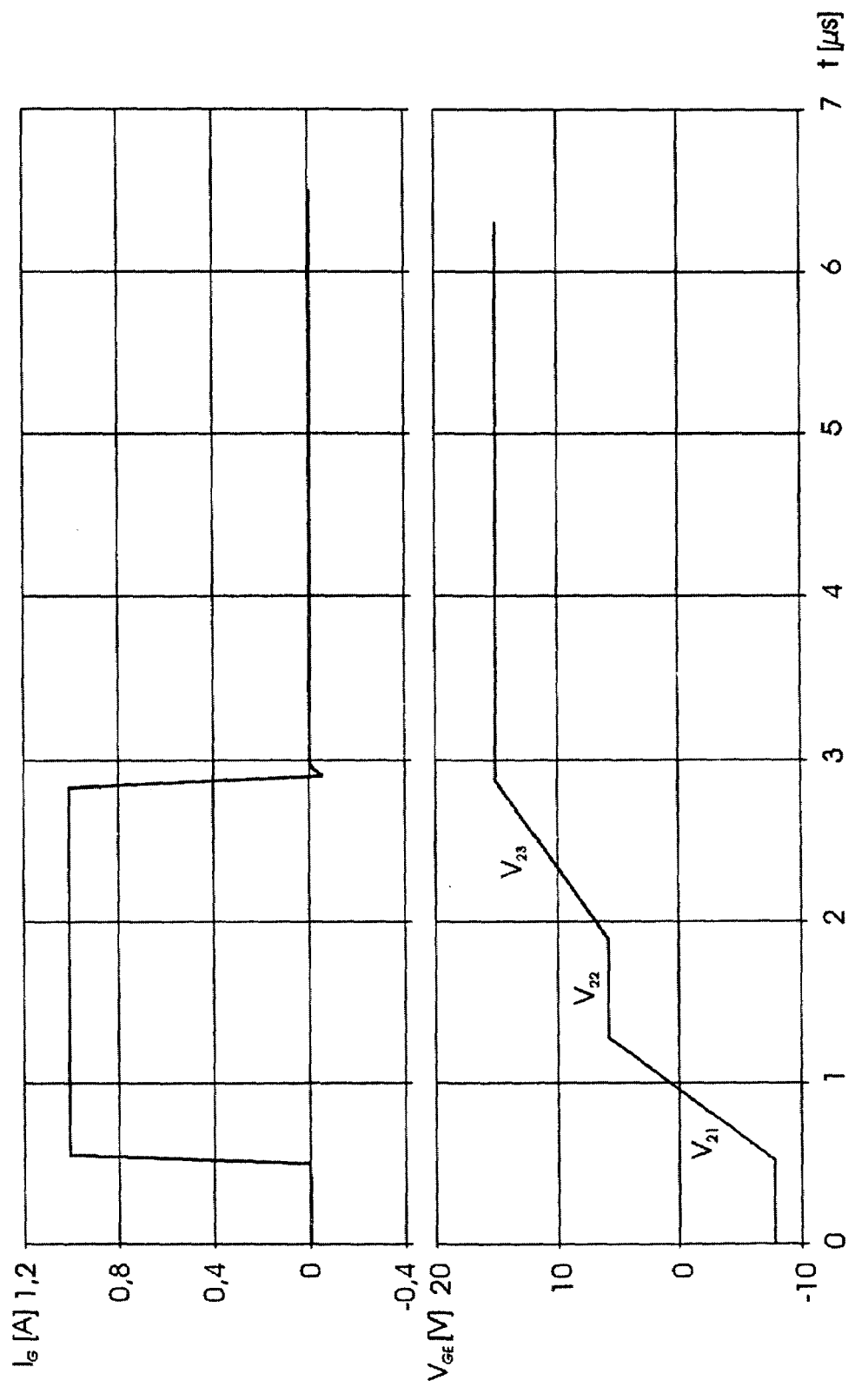
FIG. 3 is a graphical representation of the time path of the gate-emitter voltage with resistor control during a commutation process according to the present invention.

Additionally referring now to FIG. 3, simulation is shown of the time path of the gate-emitter voltage $V_{GE}$ and of the charging current IO of the gate with current control according to the invention during a commutation process. Characteristic for the inventive current control is the constant charging current ($I_G$). During the charging process, the voltage $V_{GE}$ rises linearly ($V_{21}$) until the Miller plateau ($V_{12}$) is reached. Subsequently, the voltage rises linearly again ($V_{23}$) until the expected value of 15V is reached.

In comparison with the corresponding conventional curves shown in FIG. 1, it is clearly evident that the inventive circuit arrangement charges the gate in about half the time (about 3 μs) to reach the expected $V_{GE}$ value. Here, a particular advantage is that the circuit arrangement allows the linear path ($V_{23}$) of the gate-emitter voltage after the Miller plateau ($V_{22}$), which allows the power transistor to switch at a substantially faster rate, as shown.

Consequently, as clearly depicted in FIG. 3, the advantages described above are easily achieved, namely: (1) The commutation process requires little time, and this (1a) reduces power dissipation in the power transistors, and (1b) short-circuit monitoring can be activated earlier thereby increasing circuit efficiency; and (2) no regulated voltage supplies are necessary and this (2a) reduces the capacity necessary in the filter capacitors, thus saving costs, and (2b) the total technical complexity of the circuit is reduced thereby additionally saving costs.

Thus, the present invention provides substantial commercial, assembly, manufacturing and use benefits to the industry in a simplified package.

Although only a single or few exemplary embodiments of this invention have been described in detail above, those skilled in the art will readily appreciate that many modifications are possible in the exemplary embodiment(s) without materially departing from the novel teachings and advantages of this invention. Accordingly, all such modifications are intended to be included within the spirit and scope of this invention as defined in the following claims.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A current regulated circuit arrangement, for controlling at least one power semiconductor transistor, comprising:
   at least a first and a second regulated power sources and an output voltage regulator;
   said at least first and second power sources having respective first and second circuits each being substantially mirror-symmetrical to each other;
   said first regulated power source being fed from a first unregulated power source and controlling a gate of said power transistor such that said power transistor is conductive;
   said second regulated power source being fed from a second unregulated negative control voltage power source and controlling said gate of said power transistor such that said power transistor is non-conductive; and
   said output voltage regulator limiting a voltage at said gate of said power transistor to a maximum value during a use, whereby said voltage at said gate is limited to said maximum value.

2. A current regulated circuit arrangement, according to claim 1, further comprising:
   an input circuit for limiting an input voltage to said circuit arrangement; and
   said input circuit being upstream of said circuit arrangement.

3. A current regulated circuit arrangement, according to claim 1, wherein:
   said output voltage regulator controllably acts directly upon inputs of each said first and second regulated power sources, whereby said output voltage regulator limits said voltage supplied by said first and second power sources to said gate of said power transistor.

4. A current regulated circuit arrangement, according to claim 1, wherein:
   said first regulated power source further comprises:
     a circuit containing at least a first and second transistors; and
     said first and second transistors being at least one of a npn- and a n-channel type transistors.

5. A current regulated circuit arrangement, according to claim 1, wherein:
   said second regulated power source further comprises:
     a circuit containing at least a third and a fourth transistor; and
     said third and fourth transistors being at least one of pnp- and a p-channel transistors.

6. A current regulated circuit arrangement, according to claim 1, wherein:
   said at least one power transistor is a MOSFET and said second unregulated power source has zero voltage.

7. A current regulated circuit arrangement, according to claim 1, wherein:
   said at least one power transistor is an IGBT.

8. A current regulated circuit for controlling at least one power semiconductor transistor, comprising:

at least a first and a second regulated power sources and an output voltage regulator;

said at least first and second power sources having respective first and second circuit designs being substantially mirror-symmetrical to each other;

said first regulated power source being fed from a first unregulated power source and controlling a gate of said power transistor such that said power transistor is conductive;

said second regulated power source being fed from a second unregulated negative control voltage power source and controlling said gate of said power transistor such that said power transistor is non-conductive;

said output voltage regulator limiting a voltage at said gate of said power transistor to a maximum value during a use, whereby said voltage at said gate is limited to said maximum value.

an input circuit for limiting an input voltage to said circuit arrangement;

said input circuit being upstream of said circuit arrangement; and said output voltage regulator controllably acts directly upon the inputs of each said first and second regulated power sources, whereby said output voltage regulator limits said voltage supplied by said first and second power sources to said gate of said power transistor.

9. A current regulated circuit arrangement, according to claim 8, wherein:

said first regulated power source further comprises:

a circuit containing at least a first and second transistors; and said first and second transistors being at least one of a npn- and a n-channel type transistors.

10. A current regulated circuit arrangement, according to claim 9, wherein:

said second regulated power source further comprises:

a circuit containing at least a third and a fourth transistor; and said third and fourth transistors being at least one of pnp- and p-channel transistors.

11. A current regulated circuit arrangement, according to claim 10, wherein:

said at least one power transistor is a MOSFET and said second unregulated power source has zero voltage.

12. A current regulated circuit arrangement, according to claim 10, wherein:

said at least one power transistor is an IGBT.

13. An electronic device, comprising:

a current regulated circuit arrangement for controlling at least one power semiconductor transistor in said electronic device, comprising:

at least a first and a second regulated power sources and an output voltage regulator;

said at least first and second power sources having respective first and second circuits each being substantially mirror-symmetrical to each other;

said first regulated power source being fed from a first unregulated power source and controlling a gate of said power transistor such that said power transistor is conductive;

said second regulated power source being fed from a second unregulated negative control voltage power source and controlling said gate of said power transistor such that said power transistor is non-conductive;

said output voltage regulator limiting a voltage at said gate of said power transistor to a maximum value during a use, whereby said voltage at said gate is limited to said maximum value;

an input circuit for limiting an input voltage to said circuit arrangement; and said input circuit being upstream of said circuit arrangement.

14. An electronic device, according to claim 13, wherein:

said output voltage regulator controllably acts directly upon inputs of each said first and second regulated power sources, whereby said output voltage regulator limits said voltage supplied by said first and second power sources to said gate of said power transistor.

15. An electronic device, according to claim 14, wherein:

said first regulated power source further comprises:

a circuit containing at least a first and second transistors; and said first and second transistors being at least one of a npn- and a n-channel type transistors.

16. An electronic device, according to claim 14, wherein:

said second regulated power source further comprises:

a circuit containing at least a third and a fourth transistor; and said third and fourth transistors being at least one of pnp- and a p-channel transistors.

17. An electronic device, according to claim 13, wherein:

said at least one power transistor is a MOSFET and said second unregulated power source has zero voltage.

18. An electronic device, according to claim 13, wherein:

said at least one power transistor is an IGBT.

19. A current regulated circuit arrangement for controlling at least one power semiconductor transistor comprising:

a first and a second mirror-symmetrical regulated power source and an output voltage regulator;

said first regulated power source is fed from a first unregulated power source and controls a gate of the power transistor such that the power transistor is conductive;

said second regulated power source is fed from a second unregulated negative control voltage power source and controls said gate of the power transistor such that the power transistor is non-conductive; and the output voltage regulator limits the voltage at the gate of the power transistor to a predetermined maximum value.

20. A circuit arrangement according to claim 19, further comprising:

an input circuit limiting an input voltage to the circuit arrangement is provided upstream of the circuit arrangement.

21. A circuit arrangement according to claim 19, wherein: the output voltage regulator acts directly back upon the inputs of the first and second regulated power sources.

22. A circuit arrangement according to claim 19, wherein: the first regulated power source is designed as a circuit of two transistors selected from a group consisting of npn- and n-channel transistors.

23. A circuit arrangement according to claim 19, wherein: the second regulated power source is designed as a circuit of two transistors selected from a group consisting of pnp- and p-channel transistors.

24. A circuit arrangement according to claim 19, wherein: the power transistor is a MOSFET, and the second unregulated power source has zero voltage.

25. A current regulated circuit arrangement, according to claim 19, wherein:

said at least one power transistor is an IGBT.

* * * * *